(12) United States Patent
Tani et al.

(10) Patent No.: US 6,201,339 B1
(45) Date of Patent: Mar. 13, 2001

(54) PIEZOELECTRIC ACTUATOR

(75) Inventors: Kazuo Tani; Mizuaki Suzuki; Hidetaka Maeda; Youko Suzuki, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/050,792

(22) Filed: Mar. 30, 1998

(30) Foreign Application Priority Data

Mar. 31, 1997 (JP) .................................... 9-081673
Jan. 27, 1998 (JP) .................................. 10-014426

(51) Int. Cl.$^7$ .................................................. H01L 41/08
(52) U.S. Cl. ............................................................ 310/328
(58) Field of Search ...................................... 310/323, 328

(56) References Cited

U.S. PATENT DOCUMENTS

| | | | |
|---|---|---|---|
| 4,399,385 | * | 8/1983 | Osaka et al. . |
| 4,399,386 | * | 8/1983 | Osaka et al. . |
| 4,453,103 | * | 6/1984 | Vishnevsky et al. . |
| 4,831,306 | * | 5/1989 | Staufenberg, Jr. et al. ......... 310/328 |
| 4,857,792 | * | 8/1989 | Miura et al. . |
| 4,888,515 | * | 12/1989 | Tamura .............................. 310/323 |
| 5,264,755 | * | 11/1993 | Hettlage et al. .................... 310/328 |
| 5,668,432 | * | 9/1997 | Tominaga et al. . |
| 5,917,271 | * | 6/1999 | Yamamura . |

* cited by examiner

Primary Examiner—Nestor Ramirez
Assistant Examiner—Peter Medley
(74) Attorney, Agent, or Firm—Adams & Wilks

(57) ABSTRACT

A piezoelectric actuator has a vibrating member having a generally central portion and a vibratable cantilever extending from the central portion. The cantilever has a first major surface, a second major surface opposite the first major surface, a first end integrally connected to the central portion, and a second free end. A piezoelectric element is connected to the second major surface of the cantilever and is driven by a voltage signal applied thereto to undergo expansion and contraction to vibrationally drive the cantilever. A moving member is in contact with the first major surface of the cantilever to be frictionally driven by vibration of the cantilevers in response to expansion and contraction of the piezoelectric element.

50 Claims, 11 Drawing Sheets

FIG. 5
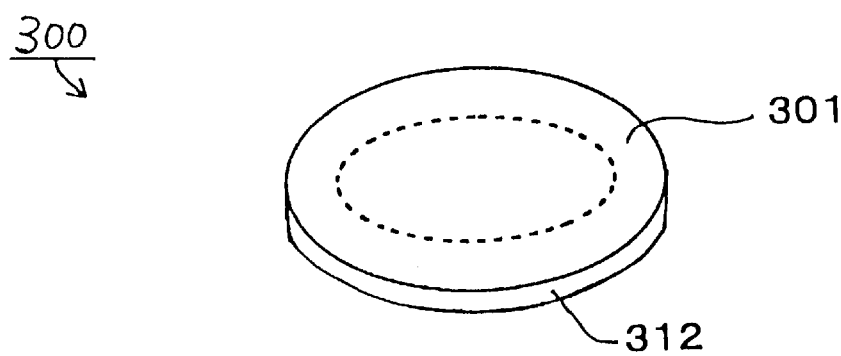
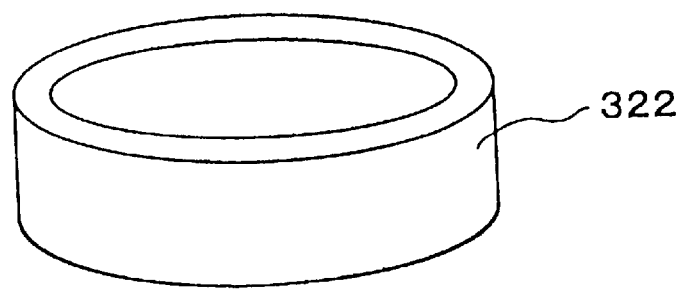
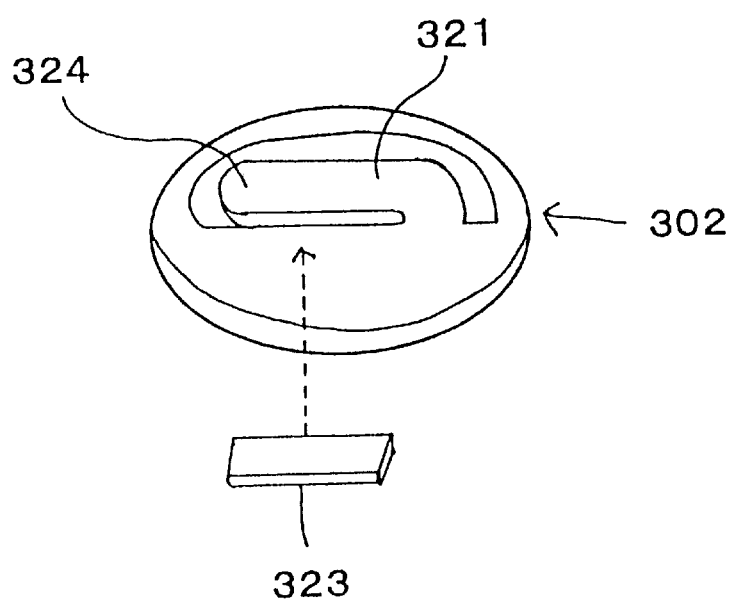

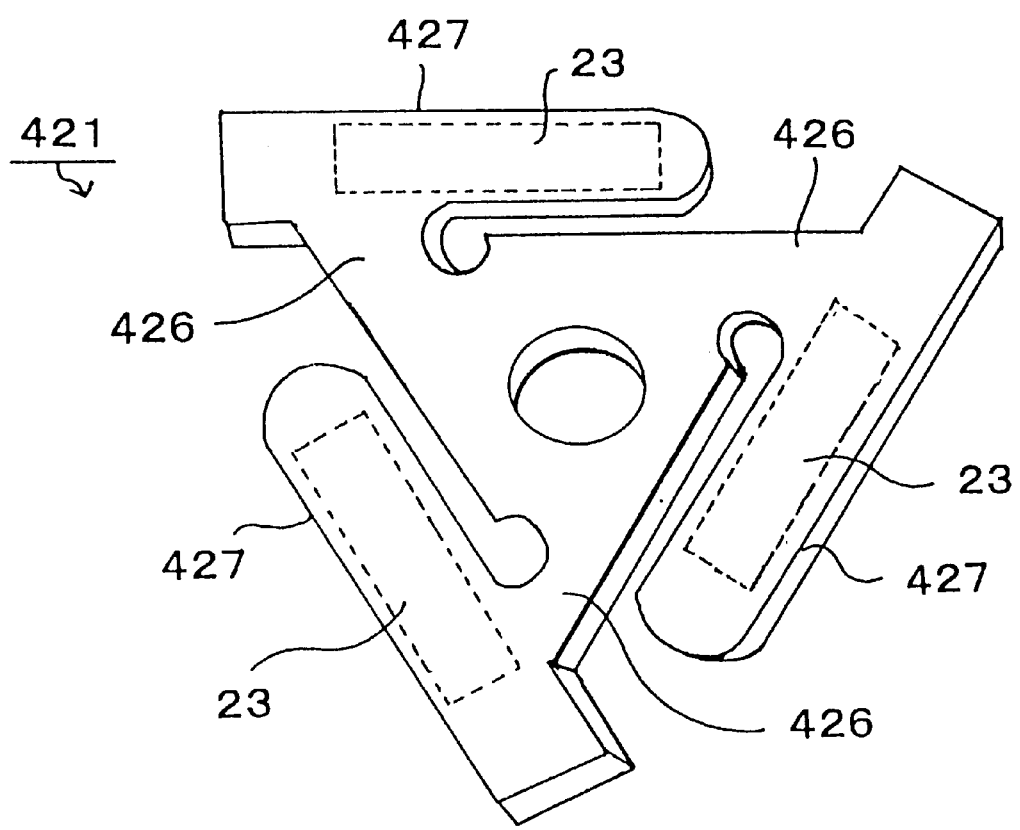

STANDING WAVE TYPE OF ULTRASONIC MOTOR
USING DISTORTED VIBRATION
(a) VIBRATING MODE EXCITED BY A VIBRATING BODY
(b) DRIVING DIRECTION AND RANGE
(c) (d) SELECTION OF A MOVING DIRECTION
ACCORDING TO A POSITION OF THE PROJECTING SECTIONS

VOLTAGE FOR DRIVING MOTOR $E_1 : E_0 \sin \omega t$  $E_2 : E_0 \cos \omega t$

DRIVING METHOD FOR A ULTRASONIC MOTOR BASED ON THE TRAVELING WAVE SYSTEM

PRINCIPLE OF OPERATION OF AN ULTRASONIC MOTOR
BASED ON THE TRAVELING WAVE SYSTEM

PIEZOELECTRIC ACTUATOR

BACKGROUND OF THE INVENTION

This invention relates to a piezoelectric actuator, and more particularly to a piezoelectric actuator which can insure high efficiency in movement conversion even when miniaturized and has improved construction of a vibrating body as well as of a movable body to insure stable rotational movement.

Generally the principle of operation of an ultrasonic motor based on the conventional technology can largely be classified as the standing wave system and the traveling wave system. At first, description is made for an ultrasonic motor based on the standing wave system. FIG. 9 is a perspective explanatory view showing an ultrasonic motor based on the conventional type standing wave system. This ultrasonic motor 900 comprises a vibrating body 910 with a piezoelectric element 912 for generating vibration in the longitudinal direction held between metallic bodies 911, and a movable body 920, and a vibrating piece 913 to be struck against the movable body 920 is provided on and projects from an edge of said vibrating body 910. The vibrating piece 913 is inclined at a specified angle against a direction of the normal line to the movable body 920. When a voltage having a frequency close to a resonance frequency of the vibrating body 910 is loaded, the vibrating body 910 vibrates, and the vibrating piece 913 provided at a tip thereof hits and contacts the movable body 920. As the vibrating piece 913 is inclined at a specified angle against the movable body 920, when the vibrating piece 913 hits the movable body 920, displacement of the vibrating piece 913 in the longitudinal direction is partially converted to that in the lateral direction. Namely, movement of a tip of the vibrating piece follows an elliptical orbit. With this operation, the movable body 920 moves in one direction.

FIG. 10 is an explanatory view showing a principle of operation of another type of ultrasonic motor based on the standing wave system. This ultrasonic motor 1000 makes use of distorted vibration, and has a plurality of projecting sections 1011 provided at a position having a displacement component of movement in the same direction on a vibrating body 1010 (Refer to (c) in the figure). Also, a vertex section of this projecting section 1011 is inclined at a specified angle. The vibrating body 1010 has a piezoelectric element (not shown) having a plurality of electric poles. With this ultrasonic motor 1000, a moving direction of the movable body is decided according to a position where the projection 1010 is provided. When a standing wave is generated by loading a voltage to the piezoelectric element ((a) and (b) in the figure), the projecting section 1011 having a displacement component in one direction as described above contacts a movable body 1020 ((c) in the figure). For this reason, the movable body 1020 moves in one direction described above. The movable body 1020 can be moved in the opposite direction by changing a position of the projecting section 1011 ((c) in the figure).

Next, description is made for an ultrasonic motor based on the traveling wave system. FIG. 11 is a perspective view showing an ultrasonic motor 1100 based on the conventional type of traveling wave system. The ultrasonic motor 1100 comprises a vibrating body 1110 comprised of a ring-shaped metallic body 1102 with a plurality of projecting sections 1101 formed in the peripheral direction and a piezoelectric ceramic element 1103 adhered to a bottom surface of the metallic body 1102, and a ring-shaped movable body 1120 pressure-fitted to a surface of this vibrating body 1110. A frictional member with excellent wearing-resistance is spanned over a contact section 1121 of the movable body 1120. Also, as shown in FIG. 12, a plurality of driving electrodes 1104 corresponding to the projecting sections 1101 are provided in the piezoelectric ceramics 1103. This ring-shaped ultrasonic motor 1100 is used as a lens actuator for automatically focusing, for instance, a single-lens reflex camera.

In this ultrasonic motor 1100, distorted vibration is loaded to the vibrating body 1110 by controlling an amplitude of the polarized piezoelectric ceramic element 1103, and exciting a traveling wave of the distorted vibration according to a phase difference of the loaded voltage. The distorted vibration of the traveling wave converts the movement in the vertical direction to movement in the lateral direction according to a thickness of the vibrating body 1110, and gives an elliptical movement as shown in FIG. 13 to the projecting section 1101 of the vibrating body 1110. The movable body 1120 is driven by the frictional force with the projecting section 1101 and moves. As height of the projecting section 1101 gives influence to displacement in the lateral direction, it is required to set a moving speed of the movable body 1120.

Further as shown in FIG. 14, the ultrasonic motor based on the traveling wave may have a disk-shaped configuration. This ultrasonic motor 1200 has a vibrating body 1210 comprising a disk-shaped metallic body 1203 with a plurality of projecting sections 1201 formed in the peripheral direction, and a shaft holder 1202 located in the center, a piezoelectric element 1204 adhered to a bottom surface of the metallic body 1203, and a disk-shaped movable body 1220 press-fitted to a surface of this vibrating body 1210. The remaining configuration and the operation are the same as those of the ring-shaped ultrasonic motor 1100 shown in FIG. 14, so that description thereof is omitted herein.

In the ultrasonic motors 900, 1000, 1100, and 1200 based on the conventional technology as described above, the rotationally moving capability is dependent on the bending rigidity of the vibrating body, the mass of the projecting section, and the mechanical machining precision and homogeneity of a tip of the projecting section contacting the movable body as well as on friction with a contacting surface of the movable body, so that it is difficult to improve and stabilize the movement conversion efficiency. For instance, in the disk-shaped ultrasonic motor 1100 based on the traveling wave system, there have been problems that the metallic body 1102 is hardly distorted because the metallic body 1102 is disk-shaped, the movement conversion efficiency is low and the rotation is sometimes unstable because the mass of the projecting section 1101 is large and, as a result, the projecting section can hardly be vibrated.

Also, if a diameter of the ultrasonic motor is made smaller, an oscillatory wave generated by the vibrating body 1110 has no vibration node, so that the oscillatory wave is easily attenuated as the diameter is made smaller. For this reason, the efficiency in conversion of movement from the piezoelectric element 1103 to the movable body 1120 becomes remarkably low, which makes it extremely difficult to reduce size of the ultrasonic motor. Also as the ultrasonic motor becomes smaller, influence of bending rigidity of the vibrating body 1110 becomes larger, so that miniaturization of ultrasonic motor is limited.

SUMMARY OF THE INVENTION

It is an object of the present invention to provide a piezoelectric actuator which can insure high movement conversion efficiency and stable rotational movement even when miniaturized as described above.

BRIEF DESCRIPTION OF THE DRAWINGS

FIG. 5 is an assembly diagram showing a rotational type of actuator according to Embodiment 3 of the present invention;

FIG. 6 is an explanatory view showing a variant of the oscillator;

DETAILED DESCRIPTION OF THE PREFERRED EMBODIMENTS

The piezoelectric actuator according to one embodiment has a rotationally movable body, and a vibrating body comprising a supporting body having a plurality of cantilevers each extending in a direction of a tangential line for an internal circle of the rotationally movable body with one edge thereof fixed and another edge thereof kept free and a plurality of piezoelectric elements adhered to the cantilevers of the supporting body, respectively.

The piezoelectric actuator according to another embodiment has a rotationally movable body, and a vibrating body comprising a supporting body having a cantilever extending in a direction of a tangential line for an internal circle of this rotationally movable body with one edge thereof fixed and another edge thereof kept free and a piezoelectric element adhered to the cantilever of the supporting body.

The piezoelectric actuator according to another embodiment has a rotationally movable body, and a vibrating body comprising a supporting body having a plurality of cantilevers each comprising long edge sections and short edge sections with the long edge sections extending in a direction of a tangential line for an internal circle of the rotationally movable body to form a free edge and also with the short edge sections fixed, and a plurality of piezoelectric elements adhered to each cantilever of the supporting body, respectively.

The piezoelectric actuator according to another embodiment has a rotationally movable body, and a vibrating body comprising a supporting body having a cantilever comprising long edge sections and short edge sections with the long edge sections extending in a direction of a tangential line for an internal circle of the rotationally movable body to form a free edge and also with the short edge sections fixed, and a piezoelectric element adhered to the cantilever of the supporting body.

The piezoelectric actuator according to another embodiment has a plurality of cantilevers extending in the opposite directions in the piezoelectric actuator described above.

Next, a detailed description is made for this invention with reference to the related drawings. It should be noted that the present invention is not limited to the embodiments described below.

EMBODIMENT 1

Figure 1:
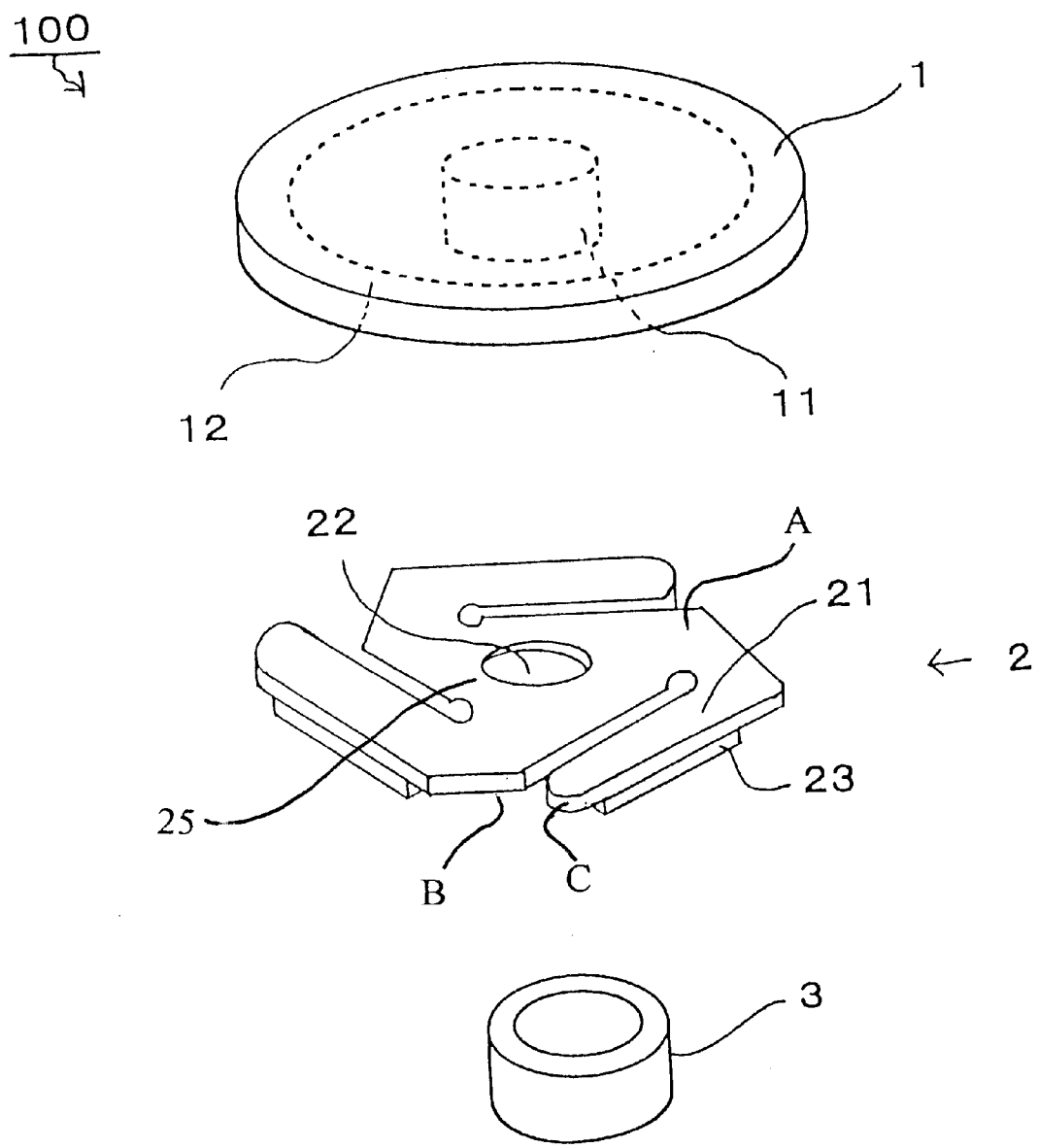
FIG. 1 is an assembly diagram showing a rotational type of actuator according to Embodiment 1 of the present invention.

FIG. 1 is an assembly view showing a rotational type actuator according to Embodiment 1 of the present invention. This rotational type of actuator 100 comprises a rotationally movable body 1 having a shaft-projecting section 11, a vibrating member or body block 2 having L-shaped oscillating elements or oscillators 21, and a support member or board chassis 3 for supporting the shaft-projecting section 11. The vibrating body block 2 has a central section 25, a first major surface A, a second major surface B opposite the first major surface, and side edges C extending between the first and second major surfaces. A magnetic material generating a magnetically attracting force is used for the rotationally movable body 1 as well as for the board chassis 3, and the rotationally movable body 1 and the vibrating body block 2 are contacted to each other under a constant pressure. For instance, a stainless-based magnetic material is used for the rotationally movable body 1, while a neodymium-based magnetic material is used for the board chassis. The board chassis 3 is attracted by this magnetic material to the side of the rotationally movable body, so that stable adhesion between a sliding section 12 of the rotationally movable body 1 and the oscillator 21 of the vibrating body block 2 is obtained. Also it is preferable to use a non-magnetic material for the vibrating body block 2, especially for the oscillator 21 so that influence by magnetism generated by the magnetic material is prevented.

The shaft-projecting section 11 of the rotationally movable section 1 is pivotally supported in a hollow bearing hole 22 of the vibrating body block 2. On the contrary, a hollow bearing hole may be provided in the side of the rotationally moving body with a shaft-projecting section provided in the side of the vibrating body block. The sliding section 12 of the rotationally movable body 1 is a section in which friction with the oscillator 22 is generated, so that it is preferable to use a material satisfying such requirements as a large frictional coefficient, high wearing-resistance, and the capability to maintain a stable frictional coefficient. For instance, a basic body of the rotationally movable body 1 is formed with a metal-based or resin-based material, and the sliding section 12 is coated with an oxide film. Also the sliding section may be made from such materials as cellulose-based fiber, a carbon-based fiber, a hybrid material between whisker and phenol resin, or a hybrid material between a polyimide resin and a polyamide resin.

Figure 2:
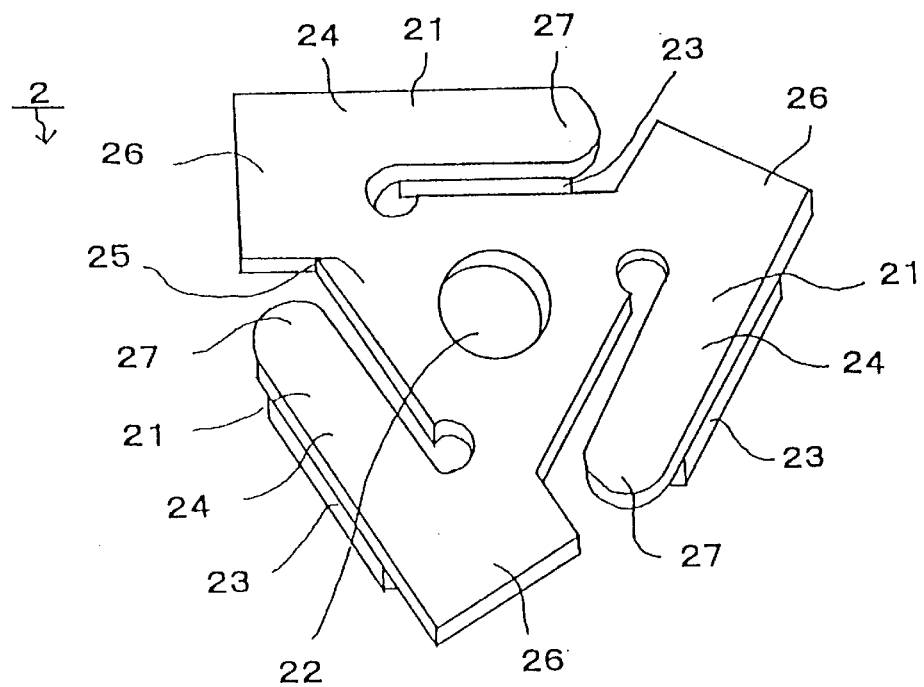
FIG. 2 is an explanatory view showing detailed construction of the vibrating body block shown in FIG. 1.

FIG. 2 shows the detailed structure of the vibrating body block 2. Three units of the oscillator 21 are provided at an even space, and each of the sections has a structure in which a piezoelectric element 23 generating extending and shrinking movement is adhered to a supporting body 24. The oscillator 21 has an L-shaped form, and a short edge section of this L-shaped form is fixed to a central section 25 of the vibrating body block 2. This oscillator 21 is positioned in an orientation identical to a direction of a tangential line for a circle included inside the sliding section 12. A rotational direction of the rotationally movable body 1 is decided according to a direction of the elliptical movement drawn by a free edge section of this oscillator 21. Herein, as the rotationally movable body 1 is pivotally supported, by matching an orbit of movement of the oscillator 21 to an orbit of movement of the rotationally movable body 1, movement conversion from the oscillator 21 to the rotationally movable section 1 can efficiently be executed.

In the figure, the oscillator 21 is provided projecting clockwise, but if the oscillator 21 is provided counterclockwise, the rotationally movable section 1 is rotated in the contrary direction. A rotational torque and a rotational speed of the rotary type actuator are decided according to a distance from a rotational center of the oscillator 21 as well as to a form and the number of the oscillators 21 provided in the vibrating body block 2. A position of the oscillator 21, namely a distance from a rotational center of the rotationally movable section 1 to the oscillator 21 or a form and the number of oscillators 21 are set according to specifications of the required rotational type actuator.

The piezoelectric element 23 is a component having a distortion generating function, a resonating function, and a voltage generating function. Namely the component generates stress or displacement according to a loaded voltage, generates resonance to a frequency of the loaded voltage, and generates a voltage according to the loaded pressure. Piezoelectric ceramics as a representative example of the piezoelectric element 23 includes barium titanate, lithium niobate, lead zircontitanate. Also a material having a tilting function or lithium niobate may be used in place of the piezoelectric ceramics. For the vibrating body block, a metal-based or a non-metal-based elastic material such as stainless steel, bellium copper, phosphorous bronze, brass, duralumin, titanium, or silicon is used.

It is preferable to use the photo fabrication technology such as etching for forming the rotationally movable body 1 or the vibrating body block 2. By using the non-mechanical machining process, it is possible to exclude deformation, stress, or mechanical stress generated when mechanically machined. Also by using high-precision parts, it is possible to miniaturize the number of processes for assembling and adjusting each component and to stabilize the functions and reproducibility.

Also the supporting body 24 and the piezoelectric element 23 are integrated to each other by means of adhesion. To realize the adhesion as described above, it is required that the adhesion layer be very thin, that the adhesion layer be very rigid and tough, and that a resistance value around the resonance frequency be very small after the piezoelectric element and the supporting body are adhered to each other. For instance, a high polymer adhesive as represented by hot-melt and epoxy resin is used for the adhesion. It should be noted that the piezoelectric element 23 is directed linked without using an adhesive. Also the piezoelectric element 23 may be provided by means of thin film formation or a pressurized-film formation. As the oscillator 21, there are the uni-morph type oscillator comprising one sheet of piezoelectric element 23, the bi-morph type oscillator comprising two sheets of piezoelectric elements, or the multi-morph type oscillator comprising four or more sheets of piezoelectric elements, and any type of the mechanism section may be used. A material for the piezoelectric element 23 or the supporting body 24 and a method of adhering the material is decided according to a displacement rate, a power, responsibility of the oscillator 21, and structural requirements required for the rotational type of actuator 100.

More specifically, in the vibrating body block 2 shown in FIG. 2, the oscillator 21 is formed with three units of piezoelectric elements 23, and the oscillators 21 are positioned at an even space along an external periphery of the vibrating body block 2. The diameter is around several millimeters. The supporting body 24 for the oscillator 21 is formed by etching a copper-based material having a thickness of around 100 microns. A thin film made from zircontitanate lead having a high piezoelectricity constant is used for the piezoelectric element 23. Even in a case of direction junction or that with an adhesive, there is a junction interface between the supporting body 24 and the piezoelectric element 23. This junction interface is an important factor for deciding the propagation characteristics between the supporting body 24 and the piezoelectric element 23. For that purpose, control of the characteristics of the adhesive to be used and its film thickness is important. In this example, an epoxy-based adhesive is used to obtain the optimal film thickness.

The form of the oscillator 21 is set taking into account the fact that the effective length, especially a length from the fixed edge to the free edge, relates to a displacement rate in movement in the longitudinal direction as well as in the elliptical orbit. Also a frequency of vibration specified to each oscillator 21 is dependent on the form, so that the parameter is decided to match the specifications from a result of simulation modeling and experimental data. The form of the vibrating body block 2 in this embodiment was decided according to a diametrical dimension of the required rotational type actuator 100 and load conditions for the rotationally movable body 1.

Also the uni-molf type oscillator 21 was employed in this embodiment 1. This type of oscillator has hardly hysteresis in the displacement voltage characteristics. The further reason is that, although a displacement rate in this type is smaller as compared to that in the bi-molf type, the generated power is larger and a load and a pressuring force to the rotationally movable body are appropriate. Also by employing the multi-molf type according to specifications of a rotary type actuator 100 to maintain the thickness at a constant level, the displacement and power can be increased by increasing the number of layers. Also the responsibility can be improved by providing a taper in a section from a fixed edge of the oscillator 21 to a free edge thereof. With the vibrating body block 2 having the configuration as described above, it is possible to excite bending and displacement by the oscillator 21 under extremely stable conditions. It should be noted that a position, a form, quantity, and configuration of the oscillator 21 of the vibrating body block 2 are not always limited to those shown in FIG. 2.

Figure 3:
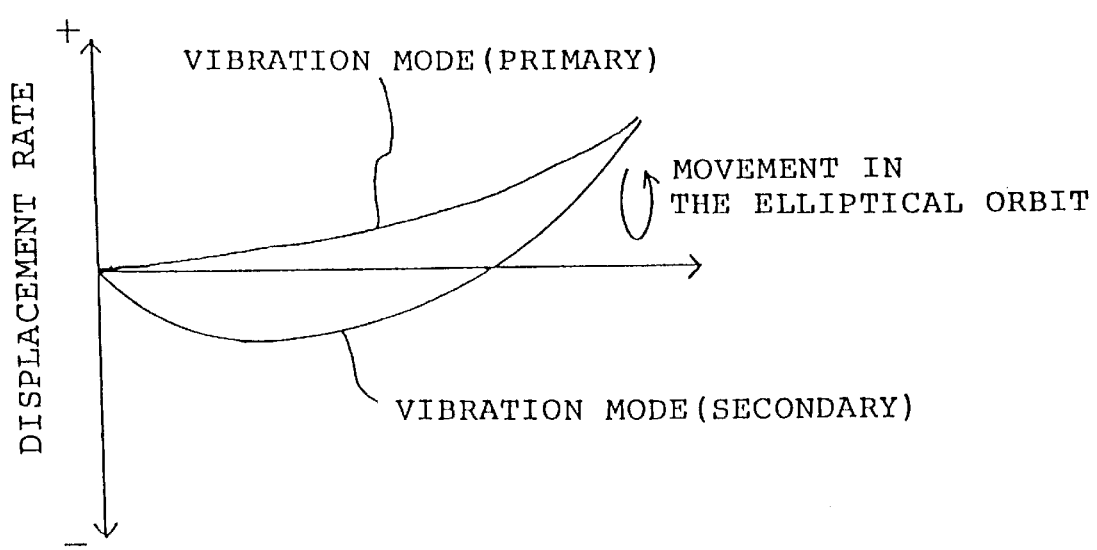
FIG. 3 is a graph showing vibrating behaviors of a section from a fixed edge of a oscillator and a free edge thereof when an input signal is loaded.

FIG. 3 shows vibrating behaviors of a section from a fixed edge 26 of the oscillator 21 to a free edge 27 thereof when an input signal is loaded thereto. A distance from a right edge of the lateral axis to a left edge is an effective length from the fixed edge 26 of the oscillator 21 to the free edge 27 thereof. The vertical axis shows a displacement rate. A displacement rate of zero (0) indicates that vibration has not been excited. The oscillator 21 generates vibration in which minute displacement and power coexist according to load conditions of an input signal to excite movement in the longitudinal direction as well as that in the elliptical orbit. In the vibrating mode, displacement of the oscillator 21 is in the positive side, so that movement is delivered from the oscillator 21 to the sliding section 12 of the rotationally movable body 1. A rotational direction of the rotationally movable body 1 is decided according to a lateral component of movement following the elliptical orbit. For this reason, the oscillator 21 of the vibrating body block 2 is positioned according to a rotational direction of the rotationally movable body 1. Also whether the rotationally movable body 1 rotates clockwise or counterclockwise is decided according to an orientation of the oscillator 21.

A loaded voltage and a frequency thereof to be inputted into the oscillator 21 are adjusted so that the parameters match dimensions and a form of the oscillator 21. When a frequency of an input signal is set to a value close to the resonance frequency, the maximum frequency of the oscillator 21 can be obtained. For vibrating the vibrating body block 2, a moving mechanism in either the primary vibration mode for enlarging displacement in which a longitudinal direction of the oscillator 21 is used or in the secondary or a higher-dimensional vibration mode can effectively be used. As a result of experiment, each vibration mode of the oscillator 21 could be confirmed in a voltage amplitude range of an input signal from 0.5 to several tens volts and in a frequency range from several tens to several hundreds K hertz. To excite rotational movement of the vibrating body block 2 under stable conditions, it is preferable to use the secondary or higher-dimensional vibration mode assuming that the voltage amplitude is in a range from 0.5 to 7 volts and the frequency is in a range from 2 to 3 hundreds K hertz. Further the rotationally movable body 1 can be rotated under stable conditions by making use of a phase difference of the input signal, by controlling a duty, or by making use of the multiplex vibration mode.

EMBODIMENT 2

Figure 4:
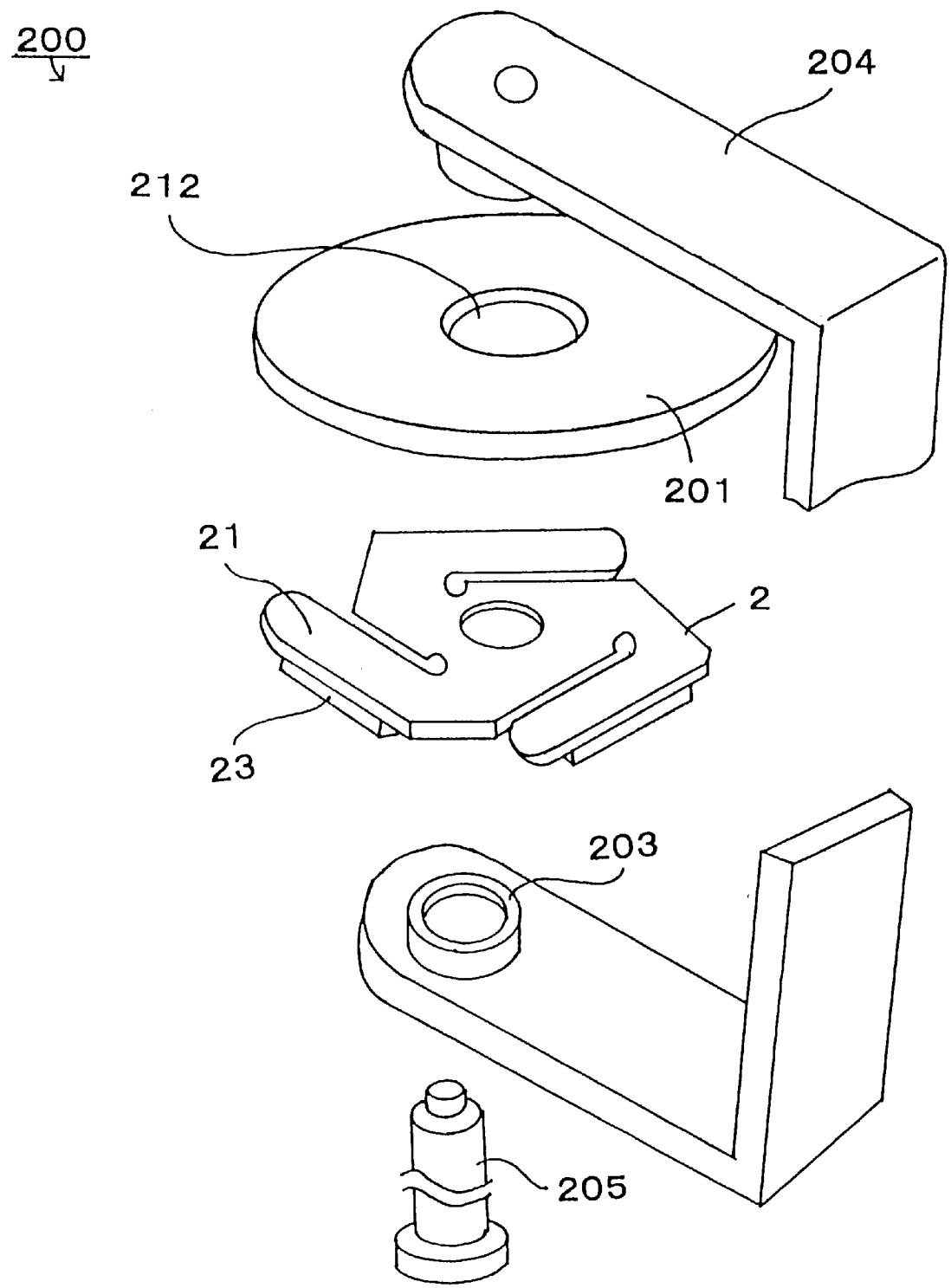
FIG. 4 is an assembly diagram showing a rotational type of actuator according to Embodiment 2 of the present invention.

FIG. 4 is an assembly diagram showing a rotational type actuator according to Embodiment 2 of the present invention. This rotational type actuator 200 comprises a rotationally movable body 201 and a vibrating body block 2. Also provided on a board chassis 203 are J-shaped spring pressurizing section 204, and the rotational movable body 201 and the vibrating body block 2 are pressurized and maintained by this spring pressurizing section 204. In addition to a sheet spring, a plate spring or a coil spring may be used for the spring pressurizing section 204. The rotationally movable body 201, vibrating body block 2, and board chassis 203 are pivotally supported by a supporting shaft 205. The sliding section 212 between the supporting shaft 205 and the rotationally movable body 201 is subjected to high-precision milling and fluorine surface processing in order to make a frictional coefficient small. Also as a mechanical element for pivotally supporting the rotationally movable body 201, a ball bearing or a sliding bearing may be used. It should be noted that the rotationally movable body 201 may be rotatably supported at the external periphery in place of pivotally supporting a center of the rotationally movable body 201. It should be noted that a method of manufacturing this rotationally movable body 201 and a material thereof are the same as those of the rotational type actuator 100 according to Embodiment 1 and the description thereof is omitted herein. Also as operations this rotational type of actuator 200 are substantially the same as those of the rotational type actuator 100 according to Embodiment 1, description thereof is omitted herein. With this configuration, output from the actuator can be controlled by adjusting a pressuring force of the spring pressuring section 204.

EMBODIMENT 3

FIG. 5 is an assembly diagram showing the rotational type actuator according to Embodiment 3 of the present invention. This rotational type actuator 300 comprises a disk-shaped vibrating body block 302 having one oscillator 321, a cylindrical body 322 provided around this vibrating body block 302, and a rotationally movable body 301 placed inside this cylindrical body 322 and on an upper surface of the vibrating body block 302. A material and a manufacturing method of the vibrating body block 302 and the rotationally movable body 301 are substantially the same as those of the rotational type actuator 100 according to Embodiment 1, so that description thereof is omitted herein. The oscillator 321 has an L-shaped form and is fixed at the short edge section. A sliding section 312 is provided in the spanning state on a bottom surface of the rotationally movable body 301. The oscillator 321 is positioned in a direction of a tangential line for a circle included in the sliding section 312. The oscillator 321 comprises a supporting body 324 and a piezoelectric element 323 adhered to the bottom surface thereof. Also operations of this rotational type of actuator 300 are substantially the same as those the rotational type of actuator 100 according to Embodiment 1, so that description thereof is omitted herein. There is the advantage that this rotational type actuator 300 can easily be built.

EMBODIMENT 4

The oscillator 21 in Embodiment 1 described above may be formed into a T-shaped form. FIG. 6 shows the oscillator 21 according to Embodiment 1 formed into a T-shaped form. In this oscillator 421, one edge section 426 of the T-shaped form functions as a fixed edge, and a piezoelectric element 23 is adhered to another edge section 427 thereof.

Figure 7A:
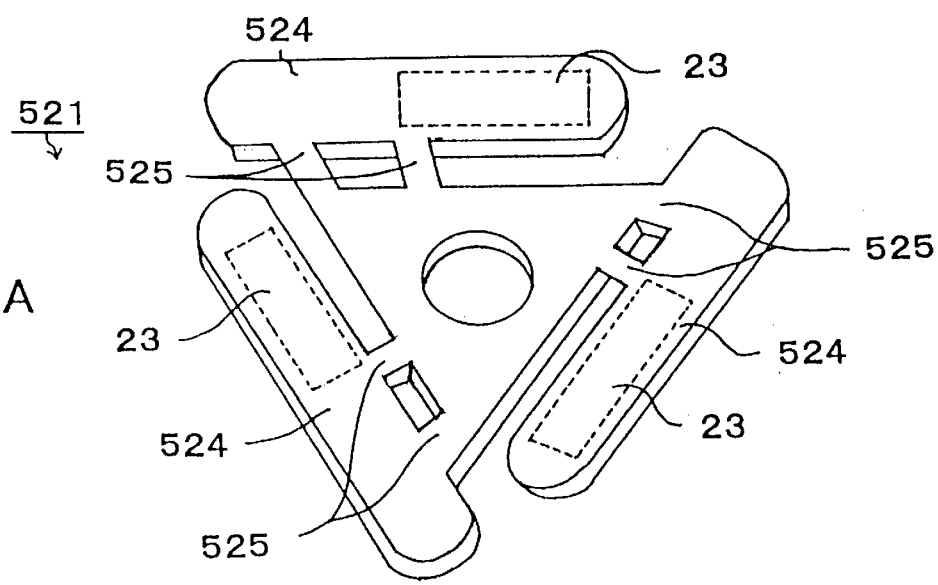
FIGS. 7A–7B are explanatory views showing other variants of the oscillator.
Figure 7B:
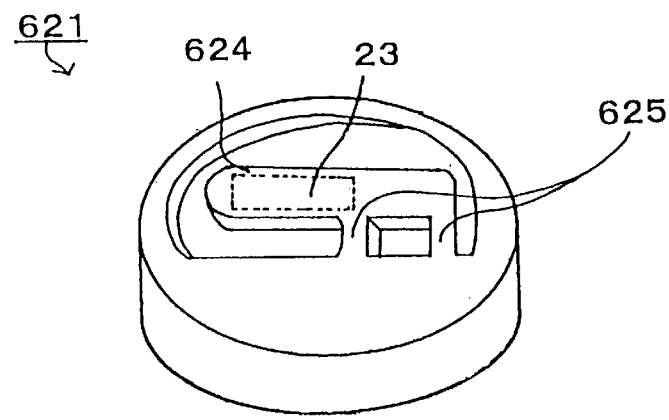

Also, the oscillator may be formed into a π-shaped form. The oscillator 21 according to Embodiment 1 formed into a π-shaped form is shown in FIG. 7A. In this oscillator 521, a supporting body 524 is supported with two leg sections 525. A piezoelectric element 23 is adhered to the supporting body 524. The oscillator 321 according to Embodiment 3 formed into a π-shaped form is shown in FIG. 7B. Also in this oscillator 621, the supporting body 624 is supported with two leg sections 625. The piezoelectric element 23 is adhered to the supporting body 624.

Figure 8A:
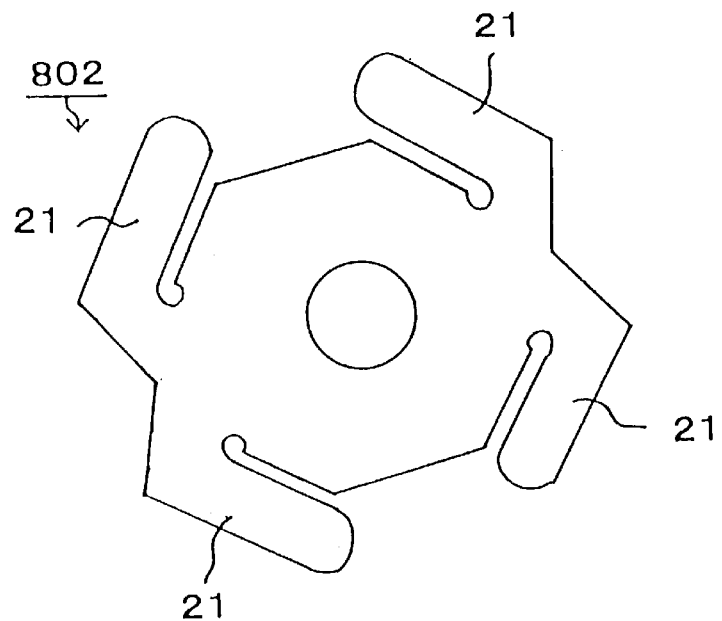
FIGS. 8A–8B are explanatory views showing other variants of the vibrating body block.
Figure 8B:
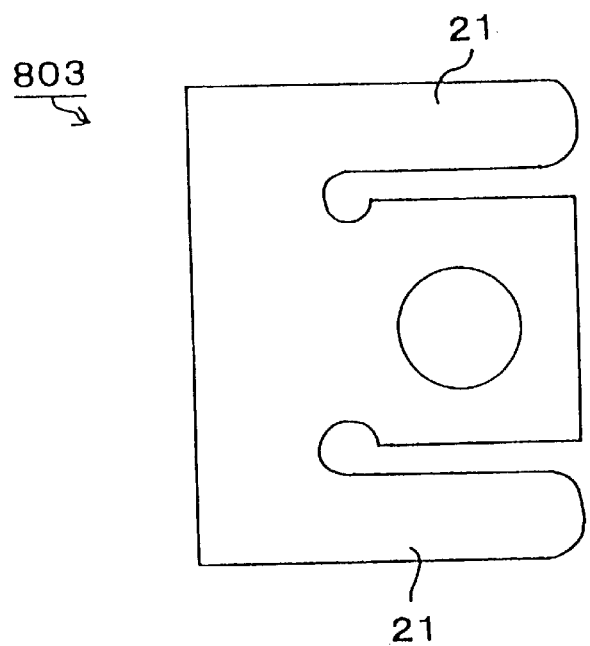
Figure 9:
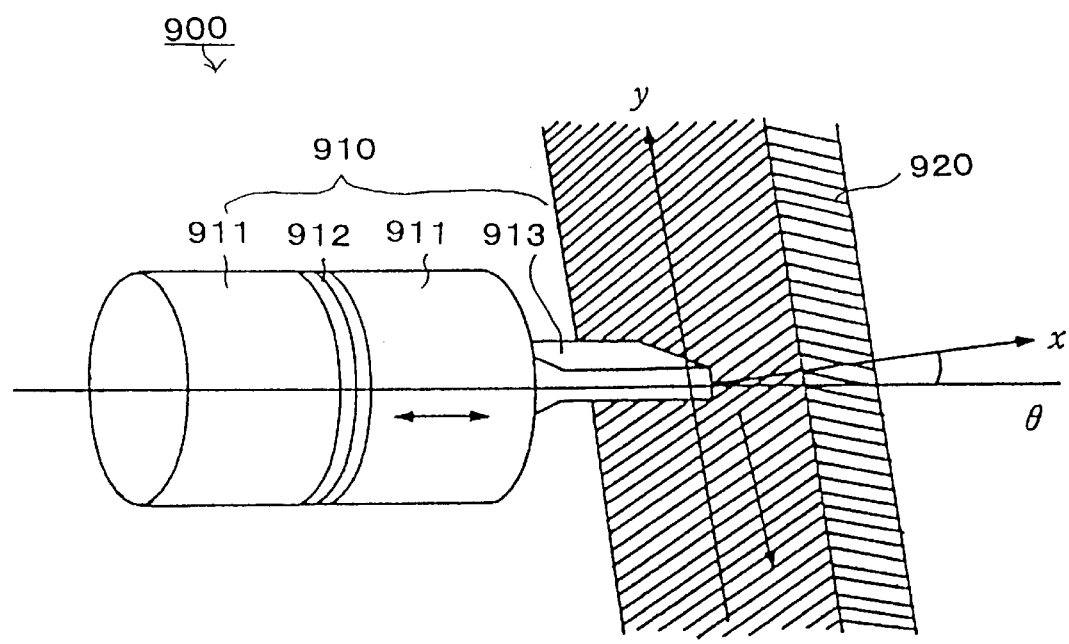
FIG. 9 is a perspective explanatory view showing an ultrasonic motor based on the conventional type standing wave system.
Figure 10:
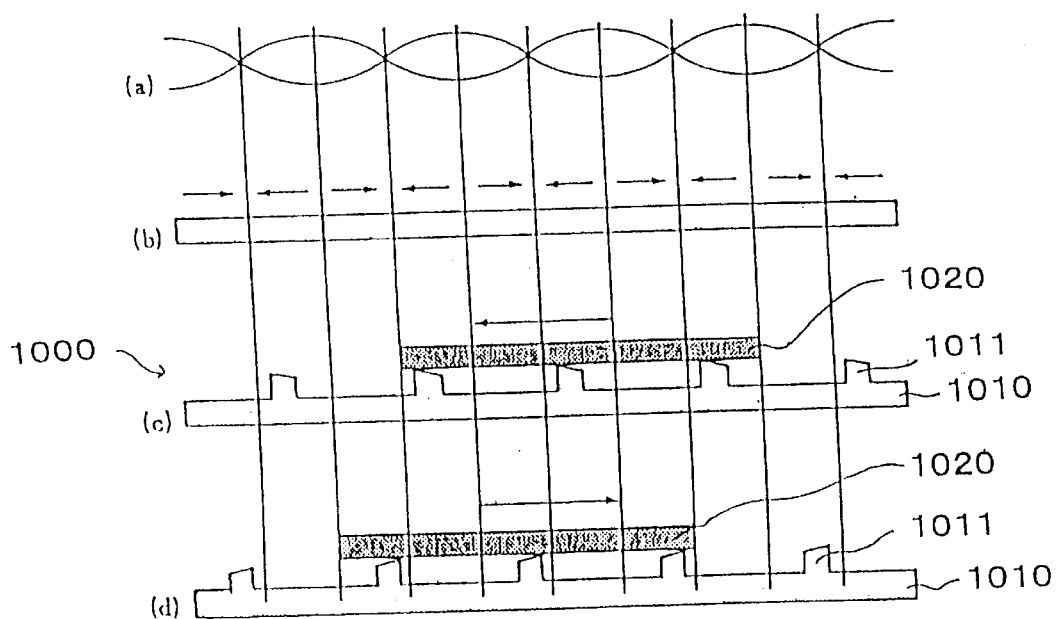
FIG. 10 is an explanatory view showing the principle of operation of another ultrasonic motor using the standing wave system.
Figure 11:
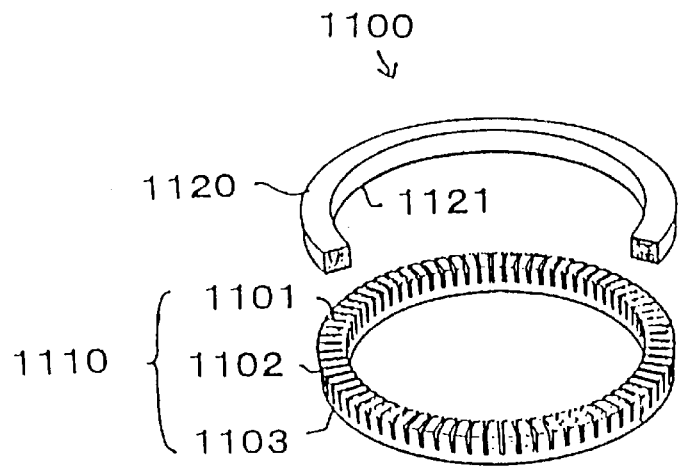
FIG. 11 is a perspective explanatory view showing an ultrasonic motor based on the conventional type traveling wave system.
Figure 12:
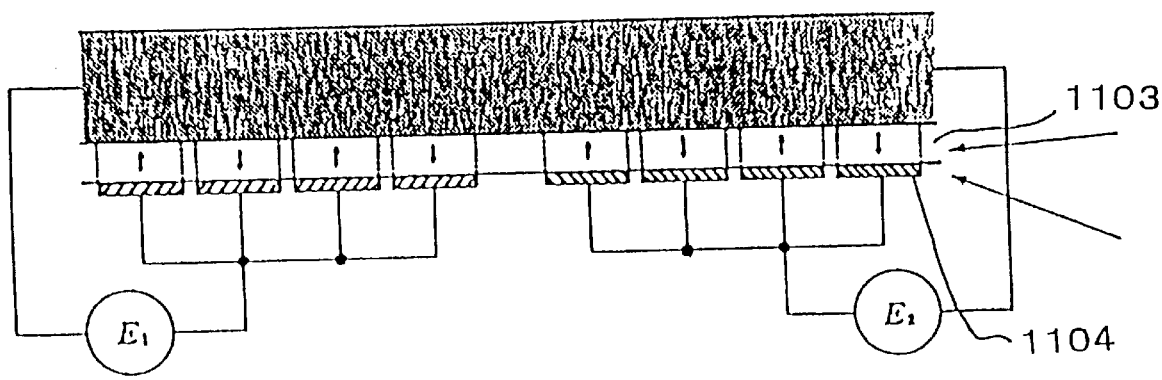
FIG. 12 is an explanatory view showing a driving electrode corresponding to the projecting section shown in FIG. 11.
Figure 13:
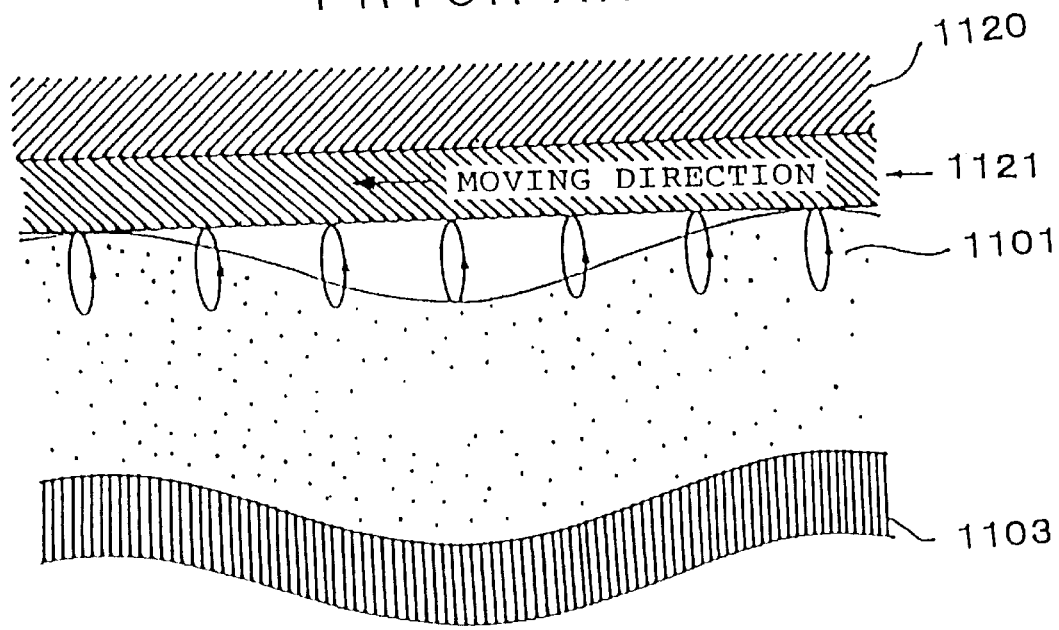
FIG. 13 is an explanatory view showing an example of movement of the projecting section shown in FIG. 11.
Figure 14:
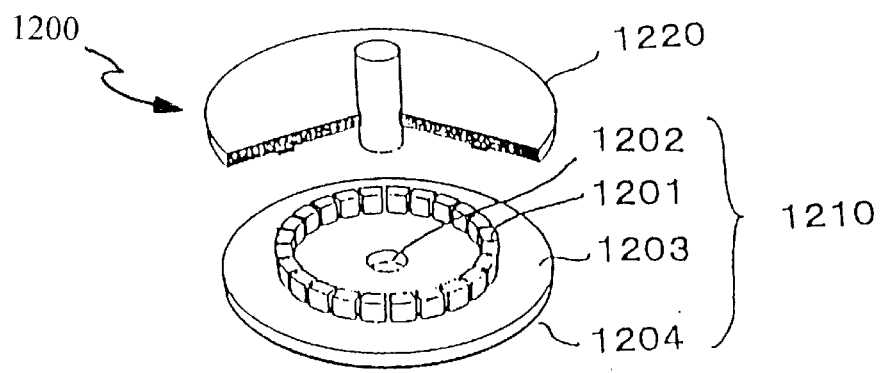
FIG. 14 is a perspective explanatory view showing a variant of the ultrasonic motor shown in FIG. 11.

Also, extending directions of the oscillators may be located in the opposite directions. A case where the two units of oscillator 21 are provided in the opposite directions is shown in FIG. 8B. A case where oscillators 21 are provided in the directions opposite to each other is shown in FIG. 8A. Other portions of the configuration are substantially the same as those in Embodiment 1. By providing extending directions of the oscillators 21 in the direction opposite to each other like those in the vibrating body blocks 802, 803, a rotational type actuator can be rotated in a regular direction and in a reverse direction by vibrating either one of the oscillators 21.

As described above, the piezoelectric actuator according to the present invention has a rotationally movable body, and a vibrating body comprising a supporting body having a cantilever extending in a direction of a tangential line for an internal circle of this rotationally movable section with one edge thereof fixed and another edge thereof kept free and a plurality of piezoelectric elements adhered to the cantilevers of the supporting section, so that the movement conversion efficiency between the vibrating body and the rotationally movable body is improved. Also it is possible to provide a smaller and thinner actuator.

The piezoelectric actuator according to the present invention has a rotationally movable body, and a vibrating body comprising a supporting body having a cantilever comprising long edge sections and short edge sections with the long edge section extending in a direction of a tangential line for an internal circle of the rotationally movable body and functioning as a free edge and also with the short edge section fixed and piezoelectric elements adhered to cantilevers of the supporting body, so that excellent movement conversion efficiency is insured even when made smaller and thinner and also stable rotational movement can be obtained.

In the piezoelectric actuator according to the present invention, a plurality of cantilevers extend in the opposite directions, so that it is possible to realize an actuator having a simple construction and capable of rotating in both regular and reverse directions. Also the excellent movement conversion efficiency is maintained even when made smaller and thinner and stable rotational movement can be obtained.

What is claimed is:

1. A piezoelectric actuator comprising: a vibrating member having a first major surface, a second major surface opposite the first major surface, a central portion, and a plurality of cantilevers each having a first end integrally connected to the central portion and a second free end; a rotationally movable body disposed on the first major surface of the vibrating member for undergoing rotation, each of the cantilevers of the vibrating member extending in the direction of a tangential line of an imaginary internal circle of the rotationally movable body; and a plurality of piezoelectric elements each disposed on the second major surface of the vibrating member and connected to a respective cantilever for vibrationally driving the vibrating member to rotate the rotationally movable body.

2. A piezoelectric actuator according to claim 1; wherein the cantilevers extend from the central portion of the vibrating member in different directions.

3. A piezoelectric actuator according to claim 1; wherein the cantilevers extend from the central portion of the vibrating member in the same direction.

4. A piezoelectric actuator according to claim 1; wherein the rotationally movable member substantially overlies the vibrating member.

5. A piezoelectric actuator according to claim 1; further comprising an adhesive disposed between each of the piezoelectric elements and respective cantilever of the vibrating member for adhering the piezoelectric elements to the cantilevers.

6. A piezoelectric actuator according to claim 1; further comprising a support member disposed on the second major surface of the vibrating member; and wherein the rotationally movable member and the support member are comprised of magnetic material and magnetically attract one another to maintain the rotationally movable member in pressure contact with the vibrating member.

7. A piezoelectric actuator according to claim 6; wherein the vibrating member is comprised of a non-magnetic material.

8. A piezoelectric actuator comprising: a vibrating member having a first major surface, a second major surface opposite the first major surface, a central portion, and a cantilever having a first end integrally connected to the central portion and a second free end; a rotationally movable body disposed on the first major surface of the vibrating member for undergoing rotation, the cantilever of the vibrating member extending in the direction of a tangential line of an imaginary internal circle of the rotationally movable body; and a piezoelectric element disposed on the second major surface of the vibrating member and connected to the cantilever for vibrationally driving the vibrating member to rotate the rotationally movable body.

9. A piezoelectric actuator according to claim 8; wherein the rotationally movable member substantially overlies the vibrating member.

10. A piezoelectric actuator according to claim 8; further comprising an adhesive disposed between the piezoelectric element and the cantilever of the vibrating member for adhering the piezoelectric element to the cantilever.

11. A piezoelectric actuator according to claim 8; further comprising a support member disposed on the second major surface of the vibrating member; and wherein the rotationally movable member and the support member are comprised of magnetic material and magnetically attract one another to maintain the rotationally movable member in pressure contact with the vibrating member.

12. A piezoelectric actuator according to claim 11; wherein the vibrating member is comprised of a non-magnetic material.

13. A piezoelectric actuator comprising: a vibrating body having a first major surface, a second major surface opposite the first major surface, a central portion, and a plurality of cantilevers each having a first cantilever portion having a free end and a second cantilever portion integrally connected to the central portion; a rotationally movable body disposed on the first major surface of the vibrating member for undergoing rotation, the first cantilever portion of each cantilever extending in the direction of a tangential line of an imaginary internal circle the rotationally movable body; and a plurality of piezoelectric elements each disposed on the second major surface of the vibrating member and connected to a respective cantilever for vibrationally driving the vibrating member to rotate the rotationally movable body.

14. A piezoelectric actuator according to claim 13; wherein the cantilevers extend from the central portion of the vibrating member in different directions.

15. A piezoelectric actuator according to claim 13; wherein the cantilevers extend from the central portion of the vibrating member in different directions.

16. A piezoelectric actuator according to claim 13; wherein the cantilevers extend from the central portion of the vibrating member in the same direction.

17. A piezoelectric actuator according to claim 13; wherein the rotationally movable member substantially overlies the vibrating member.

18. A piezoelectric actuator according to claim 13; further comprising an adhesive disposed between each of the piezoelectric elements and respective cantilever of the vibrating member for adhering the piezoelectric elements to the cantilevers.

19. A piezoelectric actuator according to claim 13; further comprising a support member disposed on the second major surface of the vibrating member; and wherein the rotationally movable member and the support member are comprised of magnetic material and magnetically attract one another to maintain the rotationally movable member in pressure contact with the vibrating member.

20. A piezoelectric actuator according to claim 19; wherein the vibrating member is comprised of a non-magnetic material.

21. A piezoelectric actuator according to claim 13; wherein each of the piezoelectric elements is disposed on the respective first cantilever portion of the vibrating member.

22. A piezoelectric actuator comprising: a vibrating member having a first major surface, a second major surface opposite the first major surface, a central portion, and a cantilever having a first cantilever portion having a free end a second cantilever portion integrally connected to the central portion; a rotationally movable body disposed on the first major surface of the vibrating member for undergoing rotation, the first cantilever portion extending in the direction of a tangential line of an imaginary internal circle of the rotationally movable body; and a piezoelectric element disposed on the second major surface of the vibrating member and connected to the cantilever for vibrationally driving the vibrating member to rotate the rotationally movable body.

23. A piezoelectric actuator according to claim 22; wherein the rotationally movable member substantially overlies the vibrating member.

24. A piezoelectric actuator according to claim 22; further comprising an adhesive disposed between the piezoelectric element and the cantilever of the vibrating member for adhering the piezoelectric element to the cantilever.

25. A piezoelectric actuator according to claim 22; further comprising a support member disposed on the second major surface of the vibrating member; and wherein the rotationally movable member and the support member are comprised of magnetic material and magnetically attract one another to maintain the rotationally movable member in pressure contact with the vibrating member.

26. A piezoelectric actuator according to claim 25; wherein the vibrating member is comprised of a non-magnetic material.

27. A piezoelectric actuator according to claim 22; wherein the piezoelectric element is disposed on the first cantilever portion of the vibrating member.

28. A piezoelectric actuator comprising: a vibrating member having a generally central portion and a vibratable cantilever extending from the central portion, the cantilever having a first major surface, a second major surface opposite the first major surface, a first end integrally connected to the central portion, and a second free end; a piezoelectric element connected to the second major surface of the cantilever and being driven by a voltage signal applied thereto to undergo expansion and contraction to vibrationally drive the cantilever; and a moving member in contact with the first major surface of the cantilever to be frictionally driven by vibration of the cantilever in response to expansion and contraction of the piezoelectric element.

29. A piezoelectric actuator according to claim 28; wherein the vibrating member is generally flat.

30. A piezoelectric actuator according to claim 28; wherein the moving member substantially overlies the vibrating member.

31. A piezoelectric actuator according to claim 28; further comprising an adhesive disposed between the piezoelectric element and the cantilever of the vibrating member for adhering the piezoelectric element to the cantilever.

32. A piezoelectric actuator according to claim 28; further comprising a support member connected to the central portion of the vibrating member; and wherein the moving member and the support member are comprised of magnetic material and magnetically attract one another to maintain the moving member in pressure contact with the vibrating member.

33. A piezoelectric actuator according to claim 32; wherein the vibrating member is comprised of a non-magnetic material.

34. A piezoelectric actuator according to claim 28; wherein the moving member has a projection extending from a generally central portion thereof; and wherein the vibrating member has a hole extending through the central portion thereof for receiving the projection of the moving member.

35. A piezoelectric actuator according to claim 28; wherein the cantilever is generally L-shaped.

36. A piezoelectric actuator according to claim 28; wherein the cantilever is generally T-shaped.

37. A piezoelectric actuator according to claim 28; wherein the cantilever is generally $\pi$-shaped.

38. A piezoelectric actuator comprising: a vibrating member having a generally central portion and a plurality of vibratable cantilevers extending from the central portion, each of the cantilevers having a first major surface, a second major surface opposite the first major surface, a first end integrally connected to the central portion, and a second free end; a plurality of piezoelectric elements each respectively connected to the second major surfaces of the cantilevers and being driven by a voltage signal applied thereto to undergo expansion and contraction to vibrationally drive the cantilevers; and a moving member in contact with the first major surfaces of the cantilevers to be frictionally driven by vibration of the cantilevers in response to expansion and contraction of the piezoelectric elements.

39. A piezoelectric actuator according to claim 38; wherein the vibrating member is generally flat.

40. A piezoelectric actuator according to claim 38; wherein the cantilevers extend outwardly from and are coplanar with the central portion of the vibrating member.

41. A piezoelectric actuator according to claim 38; further comprising an adhesive disposed between each of the piezoelectric elements and the respective cantilever of the vibrating member for adhering the piezoelectric elements to the cantilevers.

42. A piezoelectric actuator according to claim 38; further comprising a support member connected to the central portion of the vibrating member; and wherein the moving member and the support member are comprised of magnetic material and magnetically attract one another to maintain the moving member in pressure contact with the vibrating member.

43. A piezoelectric actuator according to claim 42; wherein the vibrating member is comprised of a non-magnetic material.

44. A piezoelectric actuator according to claim 38; wherein the moving member has a projection extending from a generally central portion thereof; and wherein the vibrating member has a hole extending through the central portion thereof for receiving the projection of the moving member.

45. A piezoelectric actuator according to claim 38; wherein the cantilevers are generally L-shaped.

46. A piezoelectric actuator according to claim 38; wherein the cantilevers are generally T-shaped.

47. A piezoelectric actuator according to claim 38; wherein the cantilevers are generally $\pi$-shaped.

48. A piezoelectric actuator according to claim 38; wherein the plurality of cantilevers comprise at least two cantilevers.

49. A piezoelectric actuator according to claim 38; wherein the moving member substantially overlies the vibrating member.

50. A piezoelectric actuator according to claim 38; wherein the plurality of cantilevers comprise four cantilevers.

* * * * *